June 25, 1968 P. M. THOMPSON 3,390,280

SEMICONDUCTOR COUPLING MEANS FOR TWO TRANSISTORS OR GROUPS OF TRANSISTORS

Original Filed Oct. 1, 1962 2 Sheets-Sheet 1

United States Patent Office 3,390,280

Patented June 25, 1968

3,390,280

SEMICONDUCTOR COUPLING MEANS FOR TWO TRANSISTORS OR GROUPS OF TRANSISTORS

Philip M. Thompson, Stittsville, Ontario, Canada, assignor to The Plessey Company Limited, Ilford, England, a British company Continuation of application Ser. No. 238,070, Oct. 1, 1962. This application May 24, 1966, Ser. No. 552,617
8 Claims. (Cl. 307—215)

ABSTRACT OF THE DISCLOSURE

In transistor logic, the transistor of successive stages are coupled by direct connection between the collector of one stage and the base of the next-following stage through a semi-conductor element having when conducting a voltage drop considerably lower than the base-to-emitter drop of the controlled transistor. Thus silicon transistors may be coupled by germanium diodes or by silicon backward diodes.

Parallel-connected diodes in this system are preferably constructed as solid circuits which may, by suitable arrangement of terminals, incorporate a series resistance to the voltage source.

This application is a continuation of my application Ser. No. 238,070 filed Oct. 1, 1962, for Coupling of Two Transistors or Groups of Transistors.

The invention relates to the coupling of two transistors or groups of transistors and more particularly to the coupling of two transistors or groups of transistors constituting successive stages of computer logic.

It is customary in transistorised computer logic to couple consecutive stages by connecting the collector of the transistor of one stage, hereinafter called the first stage, through a coupling diode to a load resistor of which the other end lies at a potential which is positive relative to the emitter potential in the case of an N-P-N transistor, the polarity of the diode being such that the diode is conductive to current produced by the voltage between said two potentials, and to connect the base of the transistor of the next-following stage (hereinafter called "second stage") to an intermediate point of a voltage-divider resistor interposed between a potential negative to said emitter potential and the point at which the said diode is connected to the load resistor. With this arrangement the voltage divider maintains the potential at the base of the second-stage transistor below the potential at the diode-to-load resistor junction, thus causing the second transistor to become non-conducting when the first transistor conducts, notwithstanding the voltage drop across the coupling diode.

The present invention has for an object to avoid the necessity of providing a voltage divider and thus to permit simplification of the logic circuitry.

Another object is to provide semiconductor devices suitable for use as logic coupling means in transistorised computer logic. According to one aspect of the invention the coupling between the collector of the first stage transistor and the base of the second-stage transistor is effected by a semi-conductor device which when conducting produces a voltage drop which is less than the difference between the collector voltage of the first-stage transistor when this transistor is conducting and the base voltage which causes the second-stage transistor to conduct.

From another aspect, the invention consists in an electric circuit arrangement, comprising a first-stage transistor and a second-stage transistor, each having a base, an emitter, and a collector, the emitters of said two transistors being electrically interconnected so as to have equal electrical potential, a load resistor having one point connected to the collector of the first-stage transistor via a semiconductor rectifier which conducts in the direction of conduction of the first transistor, and another point at a potential of such polarity relative to the common potential of the emitters as tends to produce current flow through said rectifier in the conductive direction thereof, the base of the second-stage transistor being connected to the junction of the load resistor and the rectifier junction, said rectifier being constructed to produce when conducting a voltage drop which is less than the difference between the collector voltage of the first-stage transistor when this transistor is conducting and the base voltage which causes the second-stage transistor to conduct.

When the two transistors are silicon transistors, the coupling may be effected by means of a low voltage-drop germanium diode, or alternatively a so-called silicon backward diode may be employed. The circuits according to the invention have been found to be particularly suitable for the use of solid circuit logic. Thus a number of coupling diodes connected in parallel may be constituted by a single block of semiconductor material on which a number of junction electrodes are arranged in mutually spaced relation; a number of junction electrodes may be distributed round the circumference of a circular-section block of semiconductor material, and in the case where a transistor is used for effecting each coupling, a block of collector material may be provided with a coating of base material and a number of emitters may be arranged on this coating in mutually spaced relation, a suitable base contact being also provided.

This arrangement may be designed to also incorporate a series resistance for connection to a voltage source, for example by arranging the emitters in a circle round a centrally arranged base contact, the radial distance between the base contact and the emitters being so chosen as to produce the desired resistive value.

In order that the invention may be more readily understood, reference will now be made to the drawings accompanying the specification, in which FIGURE 1 is a circuit diagram illustrating the interstage coupling of conventional low-level "NOR" logic employing transistors;

Figure 1:
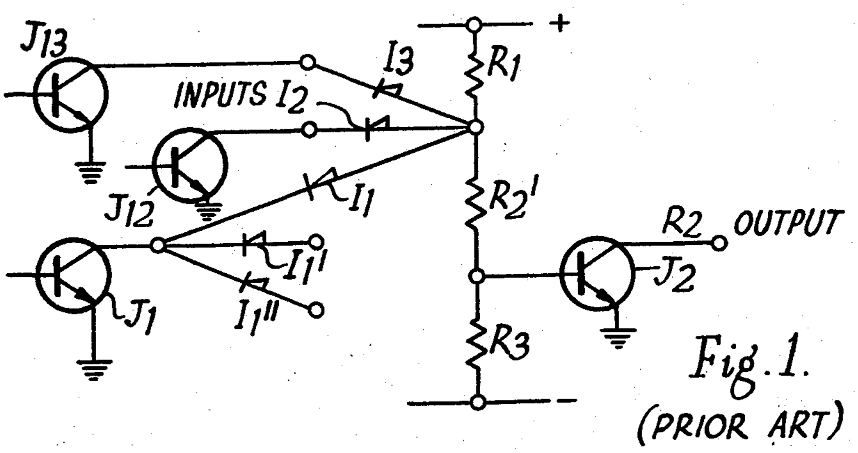
Fig. 1. (PRIOR ART)

In all the illustrated embodiments the use of P-N-P transistors has been assumed, but P-N-P transistors could alternatively be used with consequential alterations in the circuit which are obvious to those skilled in the art. Referring now first to FIGURE 1, two transistors J1 and J2 each having an earthed emitter, are coupled with the object of causing the transistor J2, hereinafter called second-stage transistor, to be rendered non-conducting when the other transistor J1, hereinafter called the first-stage transistor, becomes conducting. A source of D-C voltage is applied to three series-arranged resistors R1, R2 and R3 in such manner that when the first-stage transistors J1 is non-conducting, the potential at the junction between resistors R2 and R3, which is connected to the base of the second-stage transistor J2, is sufficiently positive to render the second-stage transistor J2 conducting, while when the first-stage transistor J1 conducts, the voltage at the collector of the first-stage transistor J1 drops to substantially earth potential. This collector is coupled by a rectifier diode $I_1$ to the junction of R1 and R2 so that, when the first-stage transistor J1 conducts, the potential at the junction R1, R2 drops to differ from earth potential only by the voltage drop across diode $I_1$. Resistor R2 is so chosen in relation to resistor R3 that under these conditions the base voltage of the second-stage transistor J2, which is determined by the potential at the junction between R2 and R3, drops below the cut-off point of transistor J2, which thus becomes non-conducting. A number of further diodes I2 and I3 are also connected to the junction of R1 and R2 and may be assumed to lead to other first-stage transistors J12 and J13 similar to J1, while conversely further diodes $I_1'$ and $I_1''$ are connected to the collector of the first-stage transistor J1 and parallel to diode $I_1$, to permit the first-stage transistor J1 to control simultaneously a number of second-stage transistors similar to transistor J2 in accordance with the requirements of the desired logic. Since transistor J2 will conduct only if neither the first-stage transistor J1 nor any one of the other first-stage transistors connected respectively to diodes I2 and I3 conducts, the circuit may be called a "NOR" circuit.

It will be noted that with this known circuit a current determined by the series resistors R1, R2 and R3 will flow continuously between the two terminals of the voltage source, the amount of this current being increased when first-stage transistor J1 or one of the other first-stage transistors becomes conducting.

Figure 2:
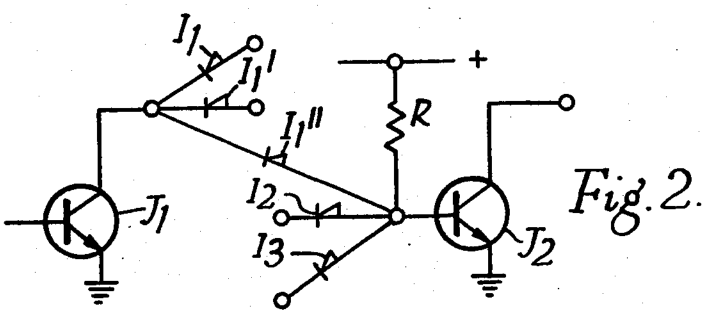
FIGURE 2 is a simpler circuit diagram of one form of circuit producing a similar result.

FIGURE 2 illustrates a modification of this circuit, in which the resistors R2 and R3, together with the need for current to flow continuously, have been eliminated. In hitherto known circuits according to FIGURE 1 the diodes $I_1$, $I_2$ etc. were constructed of the same semiconductor materials as the transistors J1, J2, etc. Thus either germanium diodes were used in conjuction with germanium transistors, or silicon diodes were used in conjunction with silicon transistors. The passage of a current through a silicon diode junction in the forward direction produces a voltage drop in the order of 0.7 volt, so that when transistor J1 in FIGURE 1 conducts, the potential of the junction between resistors R1 and R2 will drop, if silicon is used, ignoring the voltage drop in transistor J1 itself, to approximately +0.7 volt above earth potential. Accordingly if the base of the second-stage transistor J2 were directly connected to the junction of resistors R1, R2, the base of transistor J2 would remain positive by 0.7 volt, and this would be sufficient to maintain transistor J2 in its conducting condition. It is to ensure that nevertheless the base voltage of the second-stage transistor J2 is reduced below the cut-off point that the interposition of the resistors R2 and R3 is required. These resistors sub-divide the voltage drop from +0.7 volt to the negative potential of the voltage source in such manner as to drop the base potential of the second-stage transistor J2 below the cut-off point of this transistor.

In contrast to this in the arrangement of FIGURE 2, the diode $I_1$ is a germanium diode while transistors J1 and J2 are silicon transistors. In this case the voltage at the remote end of diode $I_1$ when transistor J1 conducts drops to approximately +0.25 volt, which is below the cut-off point of the second-stage transistor J2. This makes it possible to connect the base of transistor J2 direct to the coupling diode $I_1$ and to omit the voltage-divider resistors R2 and R3, while earthing the negative potential of the voltage source. With this arrangement when the second-stage silicon transistor is in the "on" condition its base will be at approximately 0.7 volt, and if the base voltage is reduced to 0.6 volt, base current will stop flowing altogether and the transistor will be turned off. Accordingly if when transistor J1 becomes conducting and the base voltage of transistor J2 is therefore reduced to 0.25 volt, viz the voltage drop in germanium diode $I_1$, the base of second-stage transistor J2 will be below its cut-off voltage by an amount of 0.35 volt. This value of 0.35 volt in conjunction with the series resistance of the base of transistor J2, the collector of transistor J1 and the diode $I_1$ controls the turn-off speed of transistor J2 while the turn-on speed is, similarly to that in the circuit of FIGURE 1, controlled by the current in load resistor R, which is connected between the base of the second-stage transistor J2 and the positive terminal of the voltage supply. It will thus be seen that the circuit illustrated in FIGURE 2 is capable of rapid switching.

It will be observed that if the transistors J1 and J2 were germanium transistors, a voltage of 0.25 volt would still be too high to render the second-stage transistor non-conductive. This shows that an essential feature of the invention consists in employing for the coupling a junction of considerably lower voltage drop than the emitter-base junction employed in the second-stage transistor. On the other hand a silicon backward diode, which is a form of diode related to the silicon tunnel diode, but in which the "hump" of the tunnel diode characteristic is replaced by a flat portion remaining substantially on the zero-current line, produces, when used in the "reverse" direction, a voltage drop of only 0.15 volt, and its forward voltage drop is generally found to be sufficiently high for making the diode non-conducting in the "forward" direction to the voltages employed in the system, so that such a diode would be highly satisfactory for use as the coupling diode such as $I_1$, not only with silicontransistors but also with germanium transistors.

Figure 3:
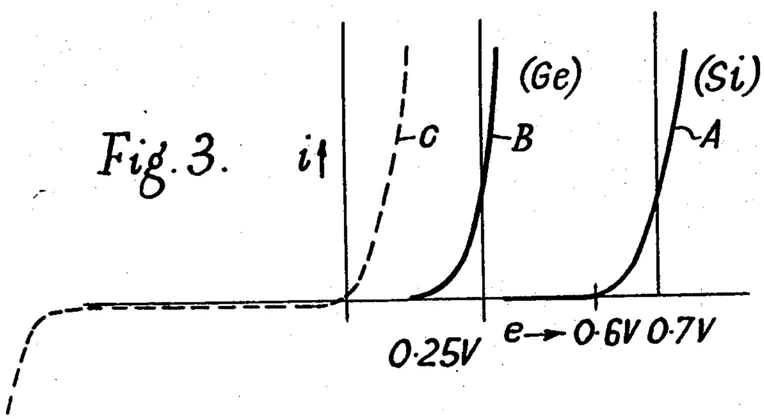
FIGURE 3 is a current-voltage diagram showing the characteristics of various types of bimetallic junction.

The current-voltage characteristics of a silicon diode, a germanium diode, and a silicon backward diode, the latter used in the "reverse" direction, are shown at A, B and C respectively in FIGURE 3.

Figure 4:
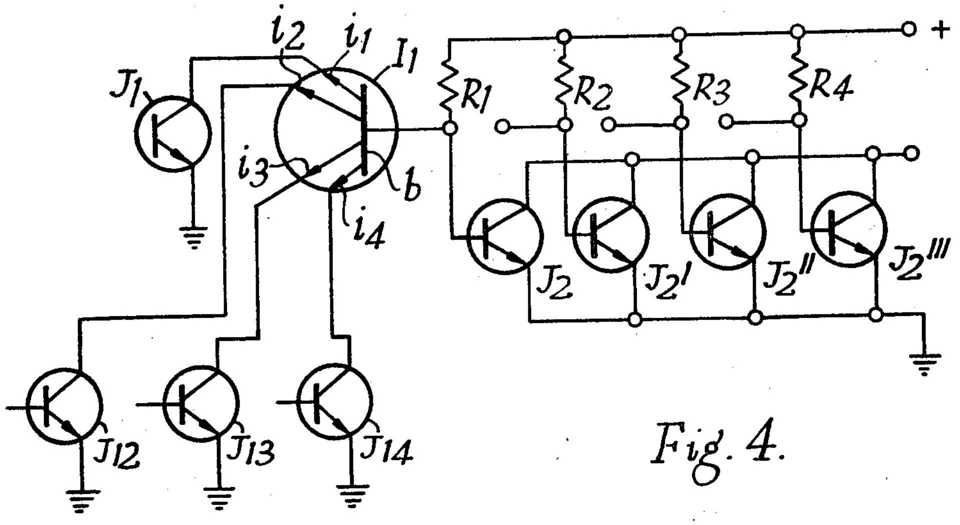
FIGURE 4 is a circuit diagram illustrating an embodiment of the invention in a form particularly suitable for the use of solid circuits and incorporating a multi-diode "AND" gate followed by a transistor "OR" gate (or vice versa)

FIGURE 4 is a circuit diagram of an embodiment in which, similarly as in FIGURE 2, a germanium diode, or a silicon backward diode, is used for coupling the collector of each of a number of first-stage transistors J1 to the base of the second-stage transistor J2, and a multiple-diode device I, consisting of a body *b* of semiconductor material forming individual diode junctions with a number of separate junction electrodes *i*1, *i*2, *i*3 and *i*4 each junction being controlled by a transistor $J_1$, $J_{12}$, $J_{13}$ and $J_{14}$ respectively. The multi-diode device I thus forms an AND gate similar to the arrangement of I1 to I3 described with reference to FIGURE 1, and a number of transistors J2, J2′, J2″ and J2‴, respectively in series with resistors R, R′, R″ and R‴ are used for the second stage to constitute an "OR" gate (or alternatively, as is usual, the diode junctions may be regarded as the "OR" gate and the transistors as the "AND" gate). Not only the diode "AND" gate but also the transistor "OR" gate can each be readily constructed as a solid circuit. Since the collectors of all the transistors J2, J2′, J2″ and J2‴ are connected in parallel, a number of spaced coatings of base material may be applied to a common block of collector material and have each an emitter applied to it individually, or conversely a separate base coating may be applied to a common block of emitter material and have each a separate collector applied to it.

Figure 5:
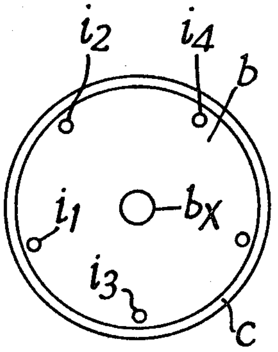
FIGURES 5 and 6 are respectively a plan view and an elevation of a practical form of multi-diode device suitable for use in this embodiment.

FIGURE 5 illustrtes a modification of the circuit of FIGURE 2 in which the diodes I1, I2, and I3 are replaced by transistors K1, K2 etc., a positive potential (in the case of an N-P-N transistor) being applied through a load resistor R to the bases of all these transistors. It will be observed that while there is a voltage drop between the base and emitter of each transistor K1, K2 etc. when the latter conducts, there is very little voltage drop between emitter and collector, so that coupling transistors provide a particularly satisfactory coupling between logic transistors J1 and J2.

Figure 6:
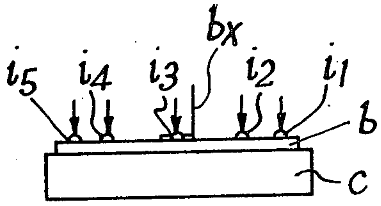

FIGURES 5 and 6 illustrate a practical form of the multi-diode device suitable for use in the embodiment of FIGURE 4.

A body $c$ carries a surface layer $b$ of semiconductor material forming a common junction electrode of substantially circular outline, and a number of separate complementary junction electrodes $i_2$, $i_2$, $i_4$ and $i_5$ are distributed round the circumference of the circular electrode $b$ to form with it individual diodes. A contact $b$X is applied to the centre of the circular electrode $b$.

The main body of the transistor consists of a body $c$0 of collector material. This collector body is coated with a layer $b$0 constituting a common base of substantially circular outline, and a number of emitters $e$1, $e$2, $e$3 etc. are distributed around the circumference of the circular base $b$0. A base terminal $b$X applied to the centre of the circular base, so that the material of the base $b$0 acts as a resistor between the terminal $b$X and the point of the base to which each emitter $e$1, $e$2, etc. is applied, this resistance being utilised to replace the resistor R shown in the diagram of FIGURE 5.

What is claimed:

1. An electric circuit arrangement, comprising a plurality of first-stage transistors and at least one second-stage transistor, each said transistor having a base, an emitter, and a collector, the emitters of all said transistors being electrically interconnected so as to have equal electrical potential, at least one load resistor each associated with one of said second-stage transistors repectively, each load resistor having one point connected to the collector of each first-stage transistor associated with such second-stage transistor via a respectively associated semiconductor-junction diode which conducts in the direction of the respective first-stage transistor, and which is one of a plurality of semiconductor-junction diodes jointly constituted by a single body of semiconductor material, on which a number of junction electrodes, respectively forming therewith the individual semiconductor-junction diodes are arranged in mutually spaced relation, each said load resistor having another point at a potential of such polarity relative to the common potential of the emitters of said transistors as tends to produce current flow through the respectively associated semiconductor-junction diode in the conductive direction of the diode, the base of the second-stage transistor being directly connected to the said body of semiconductor material so that each diode constitutes the sole voltage-separation element between the collector of a first-stage transistor and the base of the second-stage transistor, and each said semiconductor junction diode being constructed to produce when conducting a voltage drop which is less than the difference between the collector voltage of its respectively associated first-stage transistor when this transistor is conducting and the base voltage which causes the second-stage transistor to conduct.

2. A circuit arrangement as claimed in claim 1, wherein a number of junction electrodes are distributed round the circumference of a circular element of semiconductor material.

3. An electric circuit arrangement as claimed in claim 1, wherein said second-stage transistors are silicon transistors and said plurality of semiconductor-junction diodes are germanium diodes.

4. A circuit arrangement as claimed in claim 2, wherein the circular body is so designed as to incorporate said load resistors.

5. A circuit arrangement as claimed in claim 2, wherein said junction electrodes are arranged in a circle round a centrally arranged contact, the radial distance between said contact and the emitters being chosen in accordance with the desired value of the load resistors.

6. An electrical circuit arrangement comprising a first-stage transistor and a second-stage transistor, each having a base, an emitter, and a collector, the emitters of said two transistors being electrically interconnected so as to have equal electrical potential, a semiconductor diode which has one electrode connected to the collector of the first-stage transistor and which conducts in the same direction as the first-stage transistor, a load resistor having one end connected to the other electrode of said diode and having its other end connected to a potential of such polarity relative to the common potential of the emitters as tends to produce current flow through said diode in the direction of conduction thereof, the base of the second-stage transistor being directly connected to the junction of the load resistor and the diode so that the diode constitutes the sole voltage-separation element between the collector of the first-stage transistor and the base of the second-stage transistor, and the diode being constructed to produce, when conducting, a voltage drop which is less than the difference between the collector voltage of the first-stage transistor when this transistor is conducting, and the base voltage which causes the second-stage transistor to conduct.

7. An electrical circuit arrangement as claimed in claim 6, wherein said second-stage transistor is a silicon transistor and said diode is a germanium diode.

8. An electrical circuit arrangement as claimed in claim 6, wherein said diode is a silicon backward diode.

References Cited

UNITED STATES PATENTS

| | | | |
|---|---|---|---|
| 2,666,150 | 1/1954 | Blakely | 307—88.5 |
| 2,801,347 | 7/1957 | Dodge | 307—88.5 |
| 2,910,634 | 10/1959 | Rutz | 317—235 |
| 2,964,653 | 12/1960 | Cagle et al. | 307—88.5 |
| 2,986,652 | 5/1961 | Eachus | 307—88.5 |
| 3,001,088 | 9/1961 | Jochems et al. | 307—88.5 |
| 3,138,721 | 6/1964 | Kilby | 307—88.5 |
| 3,209,214 | 9/1965 | Murphy et al. | 307—88.5 |
| 3,210,621 | 10/1965 | Strull | 317—235 |
| 3,283,170 | 11/1966 | Buie | 307—88.5 |

OTHER REFERENCES

"A Survey of Semiconductor Devices and Circuits in Computers" in Semiconductor Products, vol. 4, No. 1, January 1961.

Tunnel Diode Manual by General Electric Co., March 20, 1961, pp. 9 and 10.

ARTHUR GAUSS, *Primary Examiner.*

JOHN S. HEYMAN, *Examiner.*

S. D. MILLER, *Assistant Examiner.*